United States Patent
Fukuzawa

(10) Patent No.: US 8,098,098 B2
(45) Date of Patent: Jan. 17, 2012

(54) AMPLIFIER CIRCUIT, INTEGRATED CIRCUIT DEVICE, AND ELECTRONIC INSTRUMENT

(75) Inventor: Akihiro Fukuzawa, Hino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/748,861

(22) Filed: Mar. 29, 2010

(65) Prior Publication Data

US 2010/0271130 A1  Oct. 28, 2010

(30) Foreign Application Priority Data

Apr. 28, 2009  (JP) ................................. 2009-108980

(51) Int. Cl.
*H03F 3/45* (2006.01)
(52) U.S. Cl. ........................................................ 330/259
(58) Field of Classification Search .......... 330/252–253, 330/259, 285; 327/307
See application file for complete search history.

(56) References Cited

U.S. PATENT DOCUMENTS

| 6,194,962 B1 * | 2/2001 | Chen ................................. 330/9 |
| 7,474,133 B1 * | 1/2009 | Aude et al. .................... 327/108 |
| 2008/0280578 A1 | 11/2008 | Nimura |

FOREIGN PATENT DOCUMENTS

JP  A-2008-306698  12/2008

* cited by examiner

*Primary Examiner* — Robert Pascal
*Assistant Examiner* — Khiem Nguyen
(74) *Attorney, Agent, or Firm* — Oliff & Berridge, PLC

(57) ABSTRACT

An amplifier circuit includes an amplifier section that includes a P-type differential section, an N-type differential section, and an output section, an offset adjustment section that adjusts an offset of the amplifier section, a first offset adjustment register that stores a first offset adjustment value for the P-type differential section, a second offset adjustment register that stores a second offset adjustment value for the N-type differential section, and a control section that sets the first offset adjustment value in the offset adjustment section in a first operation mode in which the P-type differential section operates, and sets the second offset adjustment value in the offset adjustment section in a second operation mode in which the N-type differential section operates.

11 Claims, 11 Drawing Sheets

OPERATION MODE M1

OPERATION MODE M2

OPERATION MODE M3

$$VQ = -\frac{R2}{R1}(VI+VD)$$

$$VQ = \frac{R2}{R1}(VD-VI)$$

$$VQ = -\frac{R2}{R1}VI + \left(1+\frac{R2}{R1}\right)VD$$

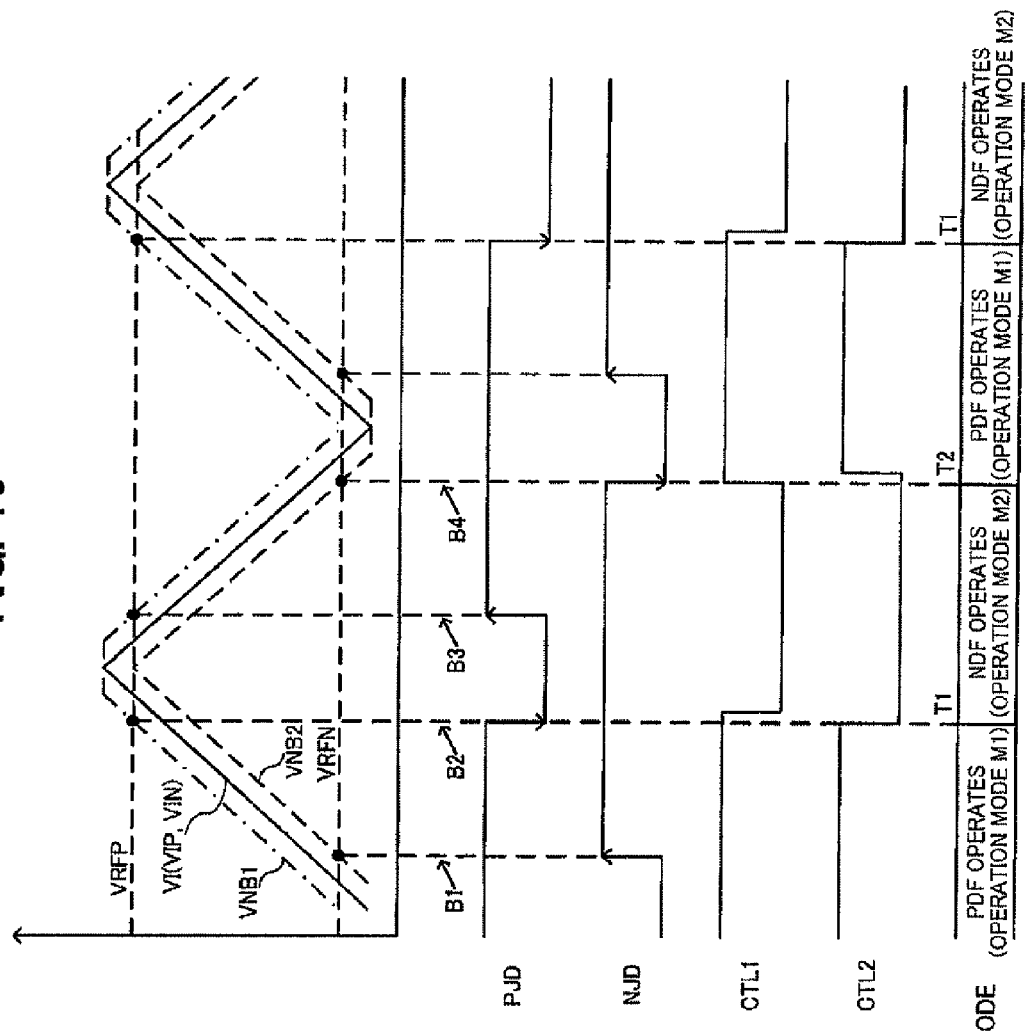

AMPLIFIER CIRCUIT, INTEGRATED CIRCUIT DEVICE, AND ELECTRONIC INSTRUMENT

Japanese Patent Application No. 2009-108980 filed on Apr. 28, 2009, is hereby incorporated by reference in its entirety.

BACKGROUND

The present invention relates to an amplifier circuit, an integrated circuit device, an electronic instrument, etc.

It is desirable that an amplifier circuit amplify an input signal over a wide input range between a high-potential-side power supply and a low-potential-side power supply. A rail-to-rail amplifier circuit is known as such an amplifier circuit. For example, FIG. 13 of JP-A-2008-306698 discloses a related-art rail-to-rail amplifier circuit.

A rail-to-rail amplifier circuit includes a P-type differential section that includes P-type transistors, and an N-type differential section that includes N-type transistors. It is desirable to operate the P-type differential section when the voltage level of the input signal is low, and operate the N-type differential section when the voltage level of the input signal is high, for example.

An offset voltage occurs in the amplifier circuit due to a difference in transistor characteristics or an asymmetrical circuit layout. Therefore, an offset adjustment that cancels the offset voltage is required.

However, it was found that the offset voltage of the amplifier circuit (operational amplifier) in a mode in which the P-type differential section operates may differ from the offset voltage of the amplifier circuit in a mode in which the N-type differential section operates. Therefore, an appropriate offset adjustment may not be implemented when switching the operation mode.

SUMMARY

According to one aspect of the invention, there is provided an amplifier circuit comprising:

an amplifier section that includes a P-type differential section that includes P-type transistors, an N-type differential section that includes N-type transistors, and an output section that outputs an output signal based on an output from the P-type differential section and an output from the N-type differential section;

an offset adjustment section that adjusts an offset of the amplifier section;

a first offset adjustment register that stores a first offset adjustment value for the P-type differential section;

a second offset adjustment register that stores a second offset adjustment value for the N-type differential section; and a control section that performs an offset setting process that sets the first offset adjustment value stored in the first offset adjustment register into the offset adjustment section in a first operation mode in which the P-type differential section operates, and sets the second offset adjustment value stored in the second offset adjustment register into the offset adjustment section in a second operation mode in which the N-type differential section operates.

According to another aspect of the invention, there is provided an amplifier circuit comprising:

an amplifier section that includes a P-type differential section that includes P-type transistors, an N-type differential section that includes N-type transistors, and an output section that outputs an output signal based on an output from the P-type differential section and an output from the N-type differential section; and a detection section that detects a first timing at which an operation mode of the amplifier section is switched from a first operation mode in which the P-type differential section operates to a second operation mode in which the N-type differential section operates, and a second timing at which the operation mode is switched from the second operation mode to the first operation mode, the detection section detecting the first timing and the second timing by voltage determination utilizing hysteresis characteristics.

According to another aspect of the invention, there is provided an integrated circuit device comprising one of the above amplifier circuits.

According to another aspect of the invention, there is provided an electronic instrument comprising the above integrated circuit.

BRIEF DESCRIPTION OF THE DRAWINGS

FIG. 10 is a view illustrative of the operation of a detailed configuration example according to one embodiment of the invention.

DESCRIPTION OF EXEMPLARY EMBODIMENTS

Figure 1:
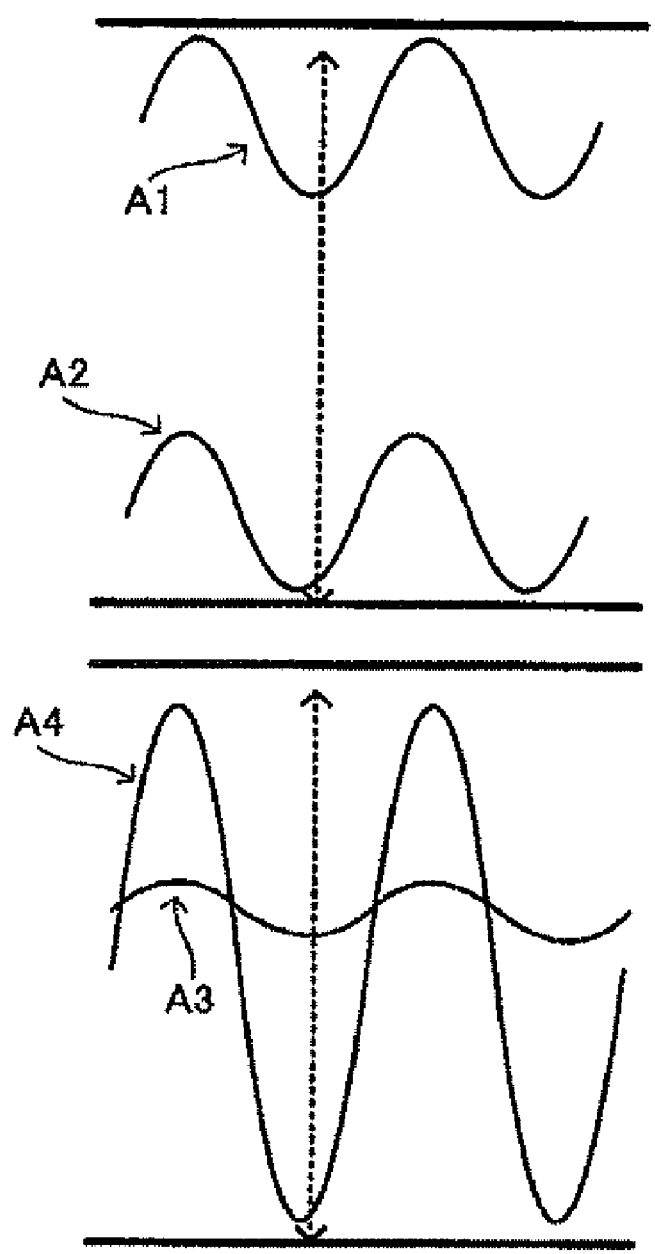
FIG. 1 is a view illustrative of a DC offset and the like of an input signal.

Several aspects of the invention may provide an amplifier circuit that is a rail-to-rail amplifier circuit and implements an appropriate offset adjustment and the like, an integrated circuit device including the amplifier circuit, an electronic instrument, etc.

According to one embodiment of the invention, there is provided an amplifier circuit comprising:

an amplifier section that includes a P-type differential section that includes P-type transistors, an N-type differential section that includes N-type transistors, and an output section that outputs an output signal based on an output from the P-type differential section and an output from the N-type differential section;

an offset adjustment section that adjusts an offset of the amplifier section;

a first offset adjustment register that stores a first offset adjustment value for the P-type differential section;

a second offset adjustment register that stores a second offset adjustment value for the N-type differential section; and a control section that performs an offset setting process that sets the first offset adjustment value stored in the first offset adjustment register into the offset adjustment section in a first operation mode in which the P-type differential section operates, and sets the second offset adjustment value stored in the second offset adjustment register into the offset adjustment section in a second operation mode in which the N-type differential section operates.

According to this embodiment, the P-type differential section, the N-type differential section, and the output section are provided in the amplifier section to implement a rail-to-rail amplifier circuit, for example. The first offset adjustment value for the P-type differential section is set in the first offset adjustment register, and the second offset adjustment value for the N-type differential section is set in the second offset adjustment register. In the first operation mode in which the P-type differential section of the amplifier section operates, the first offset adjustment value stored in the first offset adjustment register is set in the offset adjustment section to achieve an offset adjustment. In the second operation mode in which the N-type differential section operates, the second offset adjustment value stored in the second offset adjustment register is set in the offset adjustment section to achieve an offset adjustment. This makes it possible to implement an appropriate offset adjustment corresponding to each operation mode of the rail-to-rail amplifier circuit.

The amplifier circuit may further comprise:

a detection section that detects a first timing at which the operation mode is switched from the first operation mode to the second operation mode, and a second timing at which the operation mode is switched from the second operation mode to the first operation mode, the control section may perform the offset setting process based on a detection result of the detection section.

According to this configuration, when the first timing has been detected, the operation mode is switched from the first operation mode in which the P-type differential section operates to the second operation mode in which the N-type differential section operates, and an offset adjustment using the second offset adjustment value for the N-type differential section is performed. When the second timing has been detected, the operation mode is switched from the second operation mode to the first operation mode, and an offset adjustment using the first offset adjustment value for the P-type differential section is performed.

In the amplifier circuit, the detection section may detect the first timing and the second timing by voltage determination utilizing hysteresis characteristics.

A situation in which the operation mode is frequently switched between the first operation mode and the second operation mode so that the circuit operation becomes unstable can be prevented by performing voltage determination utilizing hysteresis characteristics (voltage determination in a hysteresis width voltage range).

In the amplifier circuit, the detection section may detect the first timing using a first reference voltage, and may detect the second timing using a second reference voltage that is lower in potential than the first reference voltage.

According to this configuration, voltage determination for detecting the first timing and the second timing can be implemented by the hysteresis width specified by the high-potential-side first reference voltage and the low-potential-side second reference voltage.

In the amplifier circuit, the detection section may detect the first timing by comparing a voltage of a source node of the P-type transistors of the P-type differential section with the first reference voltage, and may detect the second timing by comparing a voltage of a source node of the N-type transistors of the N-type differential section with the second reference voltage.

According to this configuration, the hysteresis width of the hysteresis characteristics can be set by effectively utilizing the difference between the voltage level of the input signal and the voltage of the source node of the P-type transistors of the P-type differential section, and the difference between the voltage level of the input signal and the voltage of the source node of the N-type transistors of the N-type differential section.

In the amplifier circuit, the detection section may include:

a first comparator that compares a voltage of a source node of the P-type transistors of the P-type differential section with the first reference voltage;

a second comparator that compares a voltage of a source node of the N-type transistors of the N-type differential section with the second reference voltage; and a signal output section that receives a comparison result signal from the first comparator and a comparison result signal from the second comparator, and outputs a first control signal and a second control signal to the amplifier section, the first control signal setting the operation mode of the amplifier section to the first operation mode, and the second control signal setting the operation mode of the amplifier section to the second operation mode.

According to this configuration, voltage determination utilizing hysteresis characteristics can be implemented by comparing the voltage of the source node of the P-type transistors of the P-type differential section with the high-potential-side first reference voltage using the first comparator, and comparing the voltage of the source node of the N-type transistors of the N-type differential section with the low-potential-side second reference voltage using the second comparator.

In the amplifier circuit, the amplifier section may include:

a first transistor that is provided between a source node of the P-type transistors of the P-type differential section and a low-potential-side power supply node, the first transistor being turned OFF in the first operation mode, and turned ON in the second operation mode; and a second transistor that is provided between a source node of the N-type transistors of the N-type differential section and a high-potential-side power supply node, the second transistor being turned ON in the first operation mode, and turned OFF in the second operation mode.

According to this configuration, the P-type differential section can be operated in the first operation mode by causing the first transistor to be turned OFF, and the N-type differential section can be operated in the second operation mode by causing the second transistor to be turned OFF.

According to another embodiment of the invention, there is provided an amplifier circuit comprising:

an amplifier section that includes a P-type differential section that includes P-type transistors, an N-type differential section that includes N-type transistors, and an output section that outputs an output signal based on an output from the P-type differential section and an output from the N-type differential section; and a detection section that detects a first timing at which an operation mode of the amplifier section is switched from a first operation mode in which the P-type differential section operates to a second operation mode in which the N-type differential section operates, and a second timing at which the operation mode is switched from the second operation mode to the first operation mode, the detection section detecting the first timing and the second timing by voltage determination utilizing hysteresis characteristics.

According to this embodiment, the P-type differential section, the N-type differential section, and the output section are provided in the amplifier section to implement a rail-to-rail amplifier circuit, for example. The first timing at which the operation mode is switched from the first operation mode in which the P-type differential section operates to the second operation mode in which the N-type differential section operates, and the second timing at which the operation mode is switched from the second operation mode to the first operation mode, are detected. The first timing and the second timing are detected by voltage determination utilizing hysteresis characteristics. This prevents a situation in which the operation mode is frequently switched between the first operation mode and the second operation mode so that the circuit operation becomes unstable.

In the amplifier circuit, the detection section may detect the first timing using a first reference voltage, and may detect the second timing using a second reference voltage that is lower in potential than the first reference voltage.

In the amplifier circuit, the detection section may detect the first timing by comparing a voltage of a source node of the P-type transistors of the P-type differential section with the first reference voltage, and may detect the second timing by comparing a voltage of a source node of the N-type transistors of the N-type differential section with the second reference voltage.

According to another embodiment of the invention, there is provided an integrated circuit device comprising one of the above amplifier circuits.

According to another embodiment of the invention, there is provided an electronic instrument comprising the above integrated circuit.

Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Operation Mode of P-Type Differential Section and N-Type Differential Section Various types of input signals that differ in DC offset or amplitude may be input to an amplifier circuit (see A1, A2, A3, and A4 in FIG. 1). For example, when amplifying a detection signal from a sensor using an amplifier circuit, the detection signal differs in DC offset or amplitude depending on the type of sensor. Therefore, in order to amplify various input signals that differ in DC offset or amplitude using an amplifier circuit, it is desirable to use a rail-to-rail amplifier circuit that has a narrow dead zone and can amplify the input signal over a wide input range between the high-potential-side power supply and the low-potential-side power supply.

Figure 2A:
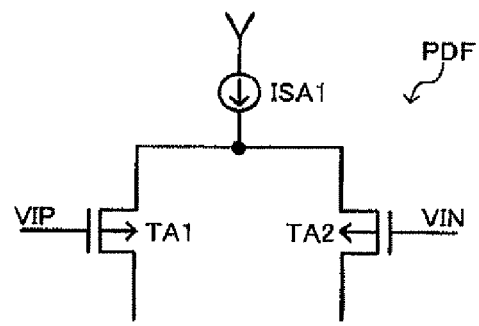
FIGS. 2A, 2B, and 2C are views illustrative of a mode in which a P-type differential section operates, a mode in which an N-type differential section operates, and a mode in which a P-type differential section and an N-type differential section operate.
Figure 2B:
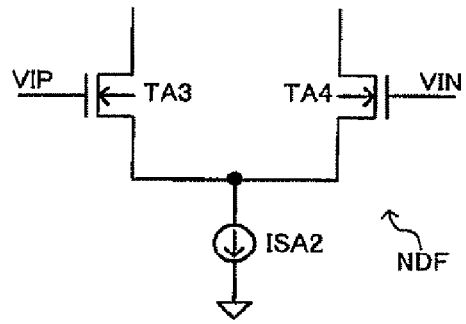

Such a rail-to-rail amplifier circuit includes a P-type differential section PDF shown in FIG. 2A and an N-type differential section NDF shown in FIG. 2B. The P-type differential section PDF includes P-type transistors TA1 and TA2 (P-type differential transistors), and the N-type differential section NDF includes N-type transistors TA3 and TA4 (N-type differential transistors).

For example, when a mode in which the P-type differential section PDF shown in FIG. 2A operates (ON or enabled) is referred to as a first operation mode M1, and a mode in which the N-type differential section NDF shown in FIG. 2B operates is referred to as a second operation mode M2, the amplifier circuit is set to the operation mode M1 shown in FIG. 2A when the voltage level of the input signal is low so that the P-type differential section PDF operates (i.e., the N-type differential section NDF does not operate). On the other hand, the amplifier circuit is set to the operation mode M2 shown in FIG. 2B when the voltage level of the input signal is high so that the N-type differential section NDF operates (i.e., the P-type differential section PDF does not operate). According to this method, the gate-source voltage of the P-type transistors TA1 and TA2 that form the P-type differential section PDF can be increased in the operation mode M1 shown in FIG. 2A. In the operation mode M2 shown in FIG. 2B, the gate-source voltage of the N-type transistors TA3 and TA4 that form the N-type differential section NDF can be increased.

According to the above first method, however, the operation mode is frequently switched between the operation mode M1 and the operation mode M2 when the voltage level of the input signal is an intermediate level, for example, so that the circuit operation becomes unstable.

Figure 2C:
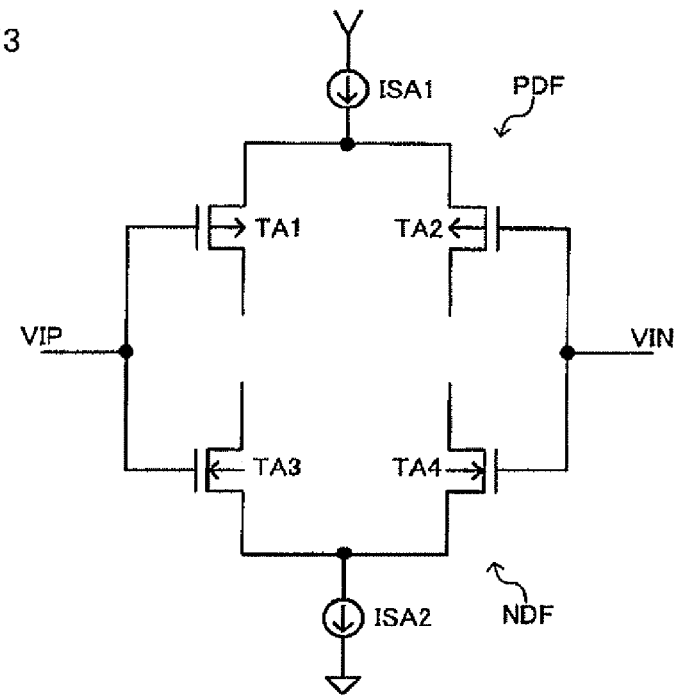

A third operation mode M3 shown in FIG. 2C in which the P-type differential section PDF and the N-type differential section NDF are operated (ON) may be provided (second method). According to the second method, the above problem that occurs when using the first method can be solved to some extent by setting the amplifier circuit to the third operation mode M3 when the voltage level of the input signal is an intermediate level, for example.

According to the second method, however, the amount of current that flows through the current source in the operation mode M1 or M2 must be four times the amount of current that flows through the current source in the operation mode M3 so that the gain of the amplifier circuit in the operation mode M1 shown in FIG. 2A or the operation mode M2 shown in FIG. 2B is equal to the gain of the amplifier circuit in the operation mode M3 shown in FIG. 2C. This makes it necessary to contrive the circuit so that the circuit configuration becomes complex, for example.

An offset voltage occurs in the amplifier circuit due to a difference in characteristics between the differential transistors, an asymmetrical circuit layout, or the like. Therefore, an offset adjustment that cancels the offset voltage is required.

However, it was found that the offset voltage of the amplifier circuit when only the P-type differential section PDF operates in the operation mode M1 shown in FIG. 2A may differ from the offset voltage of the amplifier circuit when only the N-type differential section NDF operates in the operation mode M2 shown in FIG. 2B. An accurate offset adjustment cannot be implemented when the offset voltage differs between the operation mode M1 and the operation mode M2.

2. Configuration Example

Figure 3:
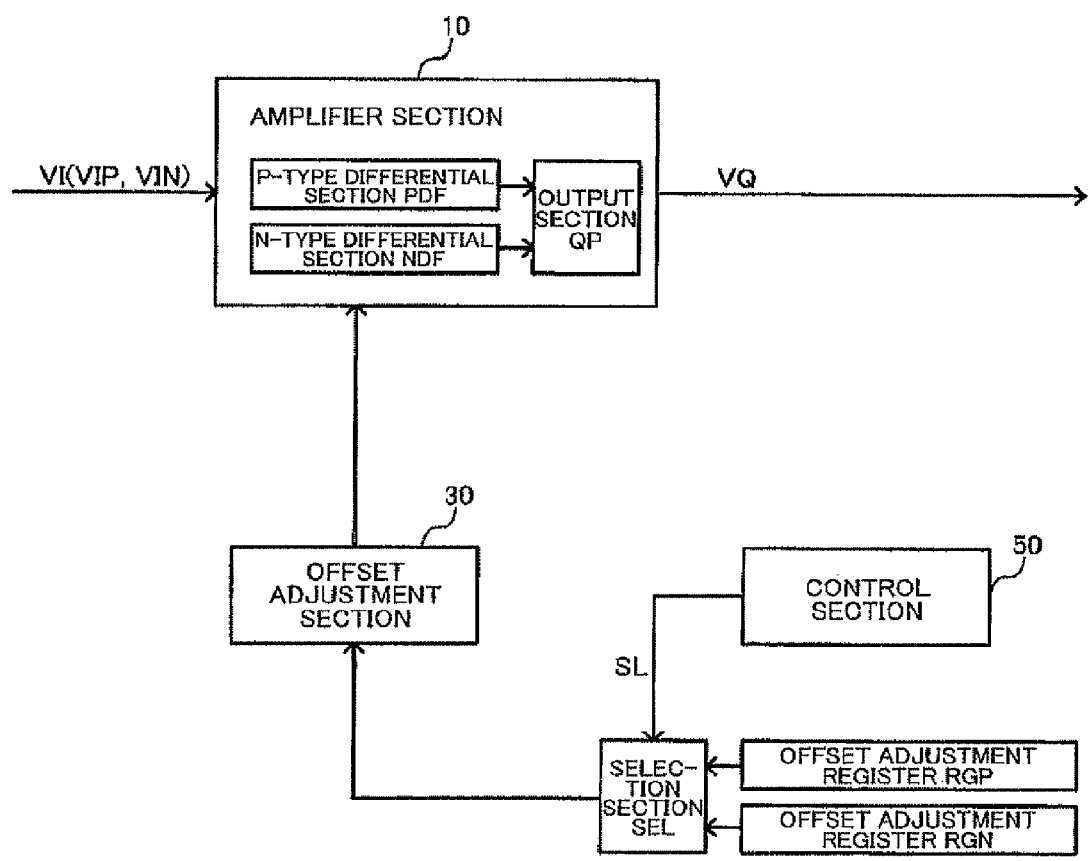
FIG. 3 shows a configuration example of an amplifier circuit according to one embodiment of the invention.

FIG. 3 shows a configuration example of an amplifier circuit according to this embodiment that can solve the above problems. The amplifier circuit includes an amplifier section 10, an offset adjustment section 30, and a control section 50. The amplifier circuit also includes a first offset adjustment register RGP, a second offset adjustment register RGN, and a selection section SEL. Note that the amplifier circuit according to this embodiment is not limited to the configuration shown in FIG. 3. Various modification may be made, such as omitting some elements or adding other elements.

The amplifier section 10 receives an input signal VI (VIP and VIN), and outputs an output signal VQ obtained by amplifying the input signal VI. The amplifier section 10 includes a P-type differential section PDF, an N-type differential section NDF, and an output section QP.

The P-type differential section PDF includes P-type differential transistors (transistor pair). Specifically, a non-inversion-side (positive) first signal VIP that forms the differential input signal VI is input to the gate of one of the P-type differential transistors, and an inversion-side (negative) second signal VIN that forms the differential input signal VI is input to the gate of the other transistor.

The N-type differential section NDF includes N-type differential transistors (transistor pair). Specifically, the first signal VIP that forms the differential input signal VI is input to the gate of one of the N-type differential transistors, and the second signal VIN that forms the differential input signal VI is input to the gate of the other transistor.

The output section QP outputs the output signal VQ of the amplifier section 10 based on the output from the P-type differential section PDF and the output from the N-type differential section NDF. The output section QP may include a P-type drive transistor that is provided between a node of a high-potential-side power supply VDD and an output node of the output signal VQ, and an N-type drive transistor that is provided between a node of a low-potential-side power supply VSS and the output node of the output signal VQ, for example.

The offset adjustment section 30 is a circuit that adjusts the offset of the amplifier section 10. The offset adjustment section 30 may include a DAC that D/A-converts an offset adjustment value, for example.

The first offset adjustment register RGP stores a first offset adjustment value (offset adjustment data) for the P-type differential section. The second offset adjustment register RGN stores a second offset adjustment value for the N-type differential section.

The first offset adjustment value stored in the offset adjustment register RGP is an offset adjustment value that is used to cancel the offset voltage of the amplifier section 10 in the first operation mode M1 in which the P-type differential section PDF operates. The second offset adjustment value stored in the offset adjustment register RGN is an offset adjustment value that is used to cancel the offset voltage of the amplifier section 10 in the second operation mode M2 in which the N-type differential section NDF operates.

The control section 50 sets the offset adjustment value in the offset adjustment section 30. For example, the control section 50 sets the offset adjustment value stored in the offset adjustment register RGP in the offset adjustment section 30 in the first operation mode M1 in which the P-type differential section PDF operates. The control section 50 sets the offset adjustment value stored in the offset adjustment register NGP in the offset adjustment section 30 in the second operation mode M2 in which the N-type differential section NDF operates.

Specifically, the amplifier circuit shown in FIG. 3 includes a selection section SEL that selects the offset adjustment value stored in the offset adjustment register RGP or the offset adjustment value stored in the offset adjustment register RGN, and outputs the selected offset adjustment value to the offset adjustment section 30. The control section 50 outputs a selection signal SL to the selection section SEL, the selection signal SL causing the selection section SEL to select the output from the offset adjustment register RGP in the operation mode M1 and select the output from the offset adjustment register RGN in the operation mode M2. The offset adjustment value corresponding to each operation mode is thus set in the offset adjustment section 30.

Note that the N-type differential section NDF does not operate (OFF or disabled) in the operation mode M1 in which the P-type differential section PDF operates (ON or enabled), for example. The P-type differential section PDF does not operate in the operation mode M2 in which the N-type differential section NDF operates, for example.

Figure 4A:
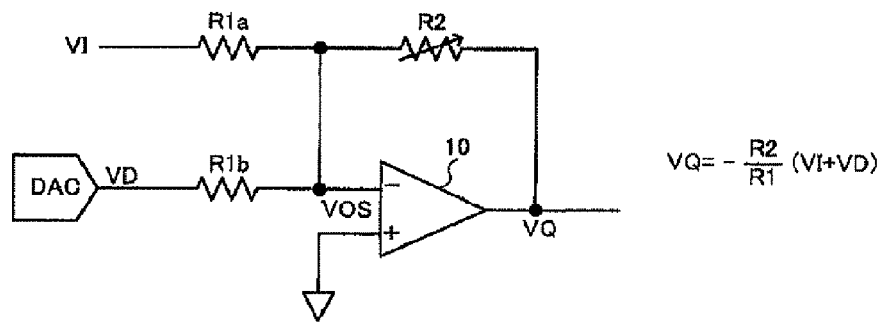
FIGS. 4A to 4C show configuration examples of an offset adjustment section.
Figure 4B:
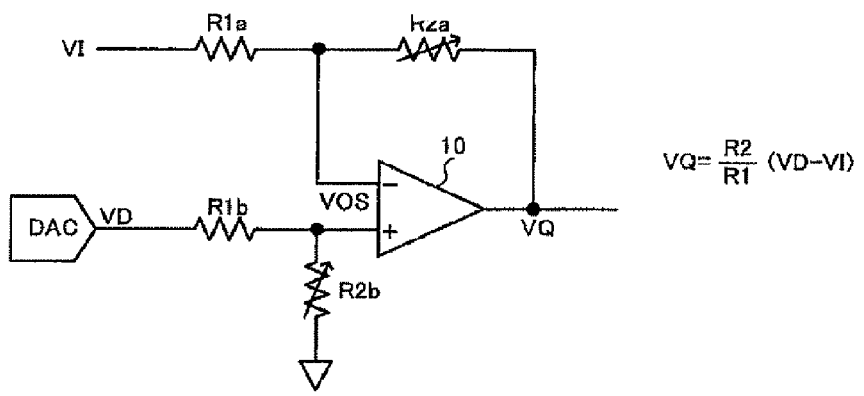
Figure 4C:
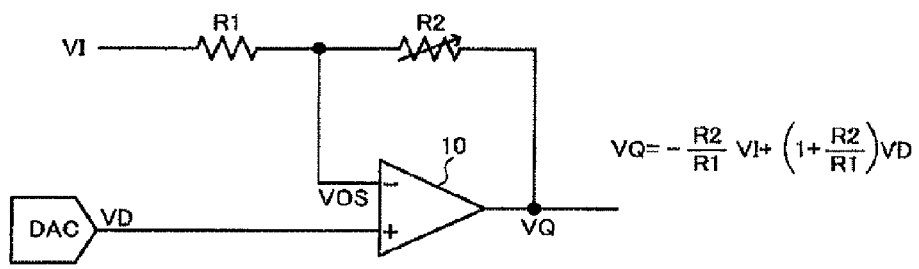

FIGS. 4A to 4C are views illustrative of various configuration examples of the offset adjustment section 30.

In the configuration shown in FIG. 4A, a DAC that forms the offset adjustment section 30, the amplifier section 10, and resistors R1$a$, R1$b$, and R2 are provided. In FIG. 4A, the resistor R2 is a variable resistor. When the resistance of the resistors R1$a$ and R1$b$ is referred to as R1, and the resistance of the resistor R2 is referred to as R2, the gain is expressed by "−R2/R1". When the output voltage of the DAC is referred to as VD, the output signal VQ is expressed by "−(R2/R1)×(VI+VD)". Therefore, an offset voltage VOS of the amplifier section 10 can be canceled by adjusting the output voltage VD of the DAC based on the offset adjustment value.

In the configuration shown in FIG. 4B, resistors R2$a$ and R2$b$ are variable resistors. When the resistance of the resistors R1$a$ and Rib is referred to as R1, and the resistance of the resistors R2$a$ and R2$b$ is referred to as R2, the gain is expressed by "R2/R1". The output signal VQ is expressed by "(R2/R1)×(VD−VI)". Therefore, the offset voltage VOS of the amplifier section 10 can be canceled by the output voltage VD of the DAC.

In the configuration shown in FIG. 4C, the resistor R2 is a variable resistor. The gain is expressed by "−R2/R1", and the output signal VQ is expressed by "−(R2/R1)×VI+(1+R2/R1)×VD". Therefore, the offset voltage VOS of the amplifier section 10 can be canceled by the output voltage VD of the DAC.

In the configuration according to this embodiment shown in FIG. 3, when the voltage level of the input signal VI is a low-potential-side voltage level (voltage level within a low-potential-side first voltage range), for example, the amplifier circuit (amplifier section) is set to the operation mode M1 so that the P-type differential section PDF operates. When the voltage level of the input signal VI is a high-potential-side voltage level (voltage level within a high-potential-side second voltage range), for example, the amplifier circuit (amplifier section) is set to the operation mode M2 so that the N-type differential section NDF operates. The gate-source voltage of the P-type transistor that forms the P-type differential section PDF and the gate-source voltage of the N-type transistor that forms the N-type differential section NDF can thus be increased so that an appropriate amplification operation of the amplifier circuit can be implemented.

According to this embodiment, the offset adjustment value for the P-type differential section that is stored in the offset adjustment register RGP is selected and input to the offset adjustment section 30 to adjust the offset of the amplifier section 10 in the operation mode M1 in which the P-type differential section PDF operates. The offset adjustment value for the N-type differential section that is stored in the offset adjustment register RGN is selected and input to the offset adjustment section 30 to adjust the offset of the amplifier section 10 in the operation mode M2 in which the N-type differential section NDF operates.

Therefore, even if the operation mode has been switched corresponding to the voltage level of the input signal VI, an appropriate offset adjustment value that is provided corresponding to each operation mode is set in the offset adjustment section 30, and an offset adjustment is performed based on the offset adjustment value. Accordingly, even if the offset voltage of the amplifier section 10 differs between the operation modes M1 and M2, an appropriate offset adjustment can be implemented in each of the operation modes M1 and M2 by setting different offset adjustment values in the offset adjustment registers RGP and RGN corresponding to the offset voltage of the amplifier section 10. This makes it possible to switch the operation mode between the operation modes M1 and M2 corresponding to the input signal VI while implementing an appropriate offset adjustment.

3. Detailed Configuration Example

Figure 5:
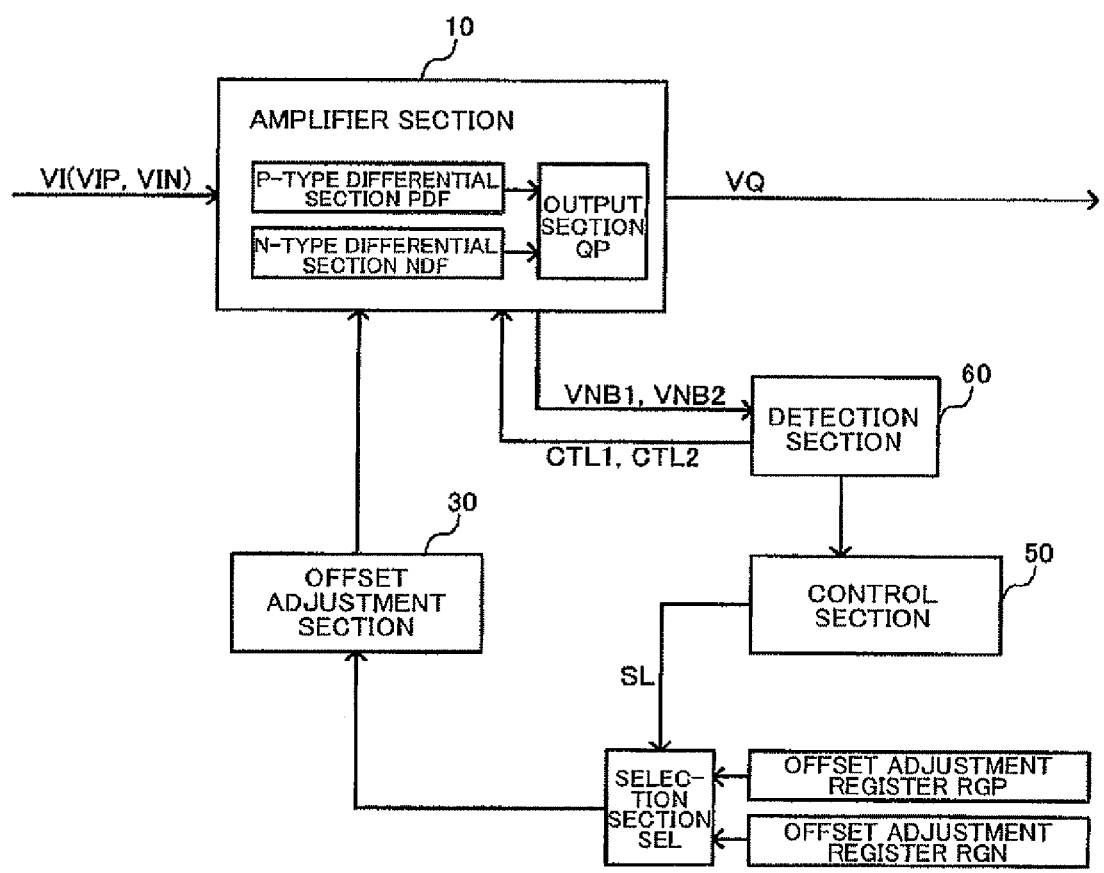
FIG. 5 shows a specific configuration example of an amplifier circuit according to one embodiment of the invention.

FIG. 5 shows a detailed configuration example of the amplifier circuit according to this embodiment. In FIG. 5, a detection section 60 is provided in addition to the elements shown in FIG. 3. The elements other than the detection section 60 are almost the same as those shown in FIG. 3. Therefore, description thereof is omitted.

The detection section 60 detects whether to operate the P-type differential section PDF or the N-type differential section NDF. For example, the detection section 60 detects a first timing T1 at which the operation mode is switched from the first operation mode M1 in which the P-type differential section PDF operates to the second operation mode M2 in which the N-type differential section NDF operates, and a second timing T2 at which the operation mode is switched from the second operation mode M2 to the first operation mode M1. The control section 50 performs the offset setting process based on the detection result of the detection section 60.

For example, when the detection section 60 has detected the first timing T1 at which the operation mode is switched from the first operation mode M1 in which the P-type differential section PDF operates to the second operation mode M2 in which the N-type differential section NDF operates, the control section 50 instructs the selection section SEL to select the offset adjustment value for the N-type differential section using the signal SL. The selection section SEL then selects the offset adjustment value stored in the offset adjustment register RGN, and sets the selected offset adjustment value in the offset adjustment section 30. The offset of the amplifier section 10 is thus adjusted using the offset adjustment value for the N-type differential section so that the offset voltage of the amplifier section 10 when the N-type differential section NDF operates can be canceled. Therefore, an appropriate offset adjustment can be implemented when the operation mode has been switched from the operation mode M1 to the operation mode M2.

When the detection section 60 has detected the second timing T2 at which the operation mode is switched from the operation mode M2 to the operation mode M1, the control section 50 instructs the selection section SEL to select the offset adjustment value for the P-type differential section using the signal SL. The selection section SEL then selects the offset adjustment value stored in the offset adjustment register RGP, and sets the selected offset adjustment value in the offset adjustment section 30. The offset of the amplifier section 10 is thus adjusted using the offset adjustment value for the P-type differential section so that the offset voltage of the amplifier section 10 when the P-type differential section PDF operates can be canceled. Therefore, an appropriate offset adjustment can be implemented when the operation mode has been switched from the operation mode M2 to the operation mode M1.

Figure 6A:
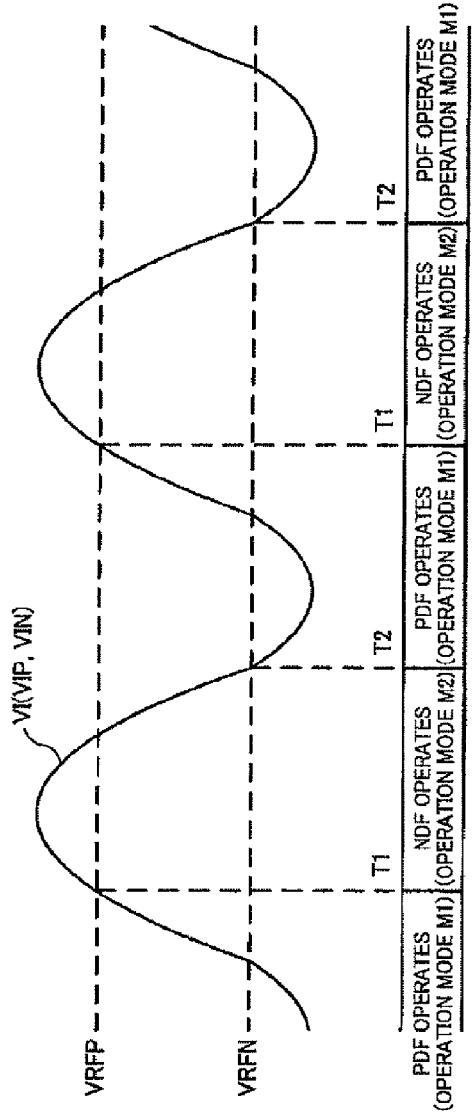
FIGS. 6A and 6B are views illustrative of the operation of a detection section.

It is desirable that the detection section 60 detect the first timing T1 and the second timing T2 by voltage determination utilizing hysteresis characteristics. Specifically, threshold voltages (reference voltages) used to determine the first timing T1 and the second timing T2 are provided with hysteresis characteristics. FIG. 6A shows a signal waveform example in this case.

In FIG. 6A, a first reference voltage VRFP and a second reference voltage VRFN are provided as the threshold voltages used to determine the first timing T1 and the second timing T2, for example. The detection section 60 detects the first timing T1 using the reference voltage VRFP, and detects the second timing T2 using the reference voltage VRFN that is lower in potential than the reference voltage VRFP.

Specifically, when the voltage level of the input signal VI rises from the low-potential-side to the high-potential-side, the operation mode is switched from the operation mode M1 to the operation mode M2 at the timing T1 at which the voltage level of the input signal VI has become higher than the high-potential-side reference voltage VRFP, so that the N-type differential section NDF operates.

When the voltage level of the input signal VI falls from the high-potential-side to the low-potential-side, the operation mode is switched from the operation mode M2 to the operation mode M1 at the timing T2 at which the voltage level of the input signal VI has become lower than the low-potential-side reference voltage VRFN, so that the P-type differential section PDF operates.

Figure 6B:
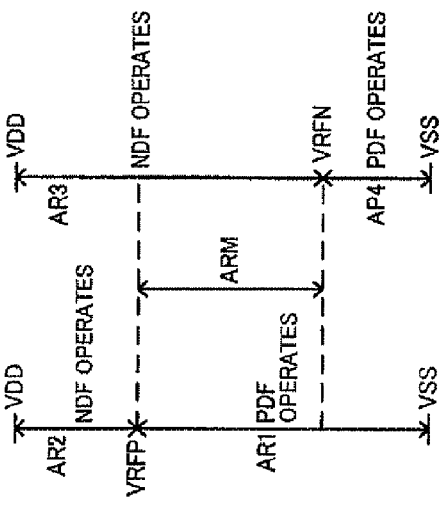

As shown in FIG. 6B, when the voltage level of the input signal VI rises, the P-type differential section PDF operates when the voltage level of the input signal VI is within a first voltage range AR1 (=VRFP to VSS), and the N-type differential section NDF operates when the voltage level of the input signal VI is within a second voltage range AR2 (=VDD to VRFP).

When the voltage level of the input signal VI falls, the N-type differential section NDF operates when the voltage level of the input signal VI is within a third voltage range AR3 (=VDD to VRFN), and the P-type differential section PDF operates when the voltage level of the input signal VI is within a fourth voltage range AR4 (=VRFN to VSS).

This prevents a situation in which the P-type differential section PDF and the N-type differential section NDF are frequently turned ON/OFF within a voltage range ARM (=VRFP to VRFN) that corresponds to the hysteresis width. Specifically, a situation in which a transition between the operation modes M1 and M2 frequently occurs within the voltage range ARM can be prevented by providing the voltage range ARM shown in FIG. 6B in which the voltage ranges AR1 and AR3 overlap, so that the circuit operation can be stabilized.

For example, when switching the operation mode between the operation mode M1 in which the P-type differential section PDF operates and the operation mode M2 in which the N-type differential section NDF operates as shown in FIGS. 2A and 2B, the operation mode is frequently switched between the operation mode M1 and the operation mode M2 when the voltage level of the input signal is an intermediate level, so that the circuit operation becomes unstable.

It may be possible to further provide the operation mode M3 in which the P-type differential section PDF and the N-type differential section NDF operate (see FIG. 2C) in order to solve such a problem. However, this method has a problem in which the circuit becomes complex, or power consumption increases.

However, a situation in which a transition between the operation modes M1 and M2 frequently occurs within the voltage range ARM can be prevented by providing the input signal voltage determination level with hysteresis characteristics, as shown in FIG. 6B.

For example, the operation mode is not switched from the operation mode M1 to the operation mode M2 even if the voltage level of the input signal VI has risen and changed within the voltage range ARM, and the amplifier circuit performs a stable amplification operation in a state in which only the P-type differential section PDF operates.

The operation mode is not switched from the operation mode M2 to the operation mode M1 even if the voltage level of the input signal VI has fallen and changed within the voltage range ARM, and the amplifier circuit performs a stable amplification operation in a state in which only the N-type differential section NDF operates. Therefore, a stable circuit operation can be implemented even if the voltage level of the input signal VI is within the intermediate voltage range ARM.

According to this embodiment, it is unnecessary to additionally provide the operation mode M3 in which the P-type differential section PDF and the N-type differential section NDF operate (see FIG. 2C). The hysteresis characteristics shown in FIGS. 6A and 6B can be implemented by merely adding an element such as the detection section 60. Therefore, a situation in which the circuit becomes complex can be prevented.

Figure 7A:
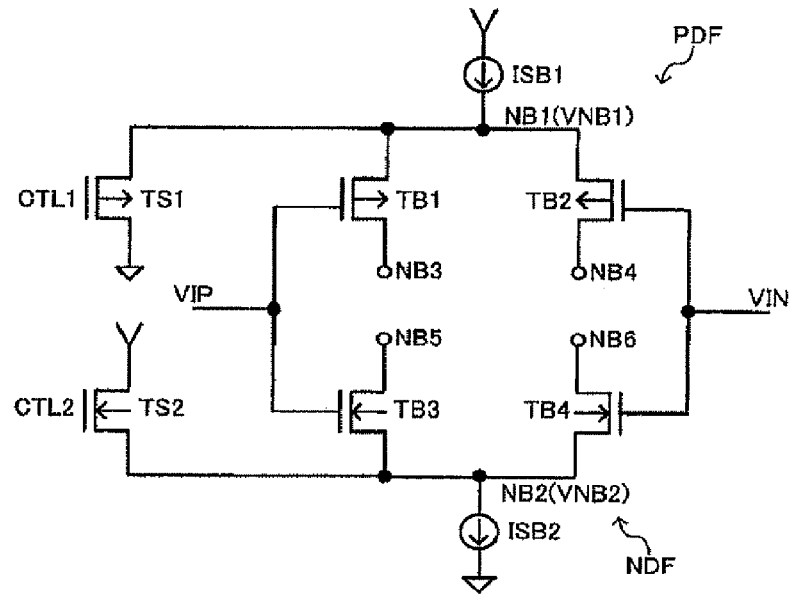
FIGS. 7A and 7B show detailed configuration examples of a P-type differential section, an N-type differential section, and an output section.
Figure 7B:
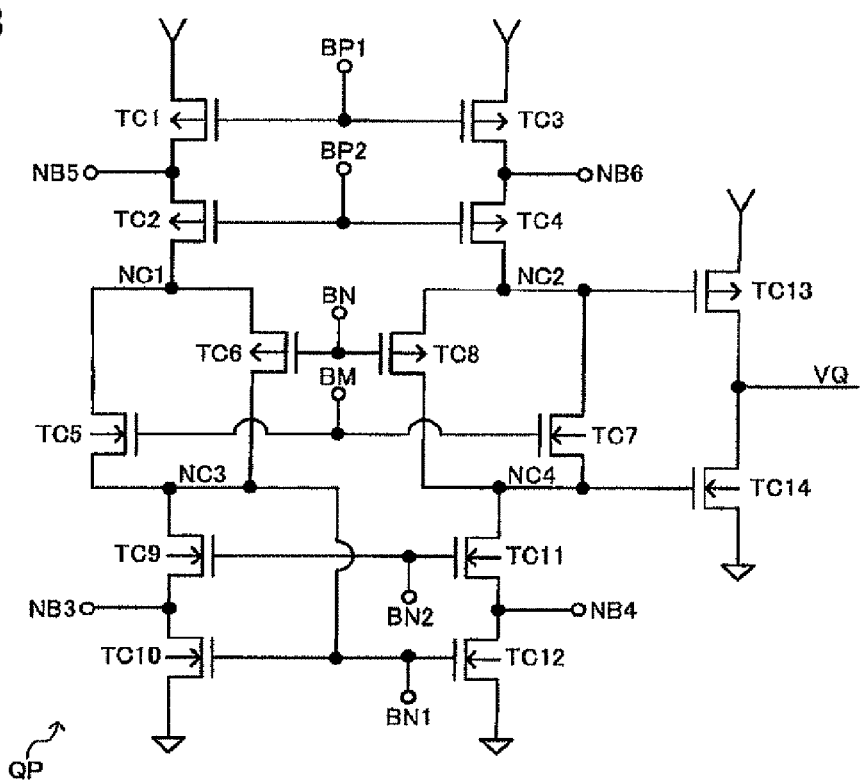

4. Detailed Configuration Example of Amplifier Section and Detection Section FIGS. 7A and 7B show a detailed configuration example of the amplifier section 10. FIG. 7A shows detailed configuration examples of the P-type differential section PDF, the N-type differential section NDF, etc., and FIG. 7B shows a detailed configuration example of the output section QP.

As shown in FIG. 7A, the P-type differential section PDF includes a pair of P-type transistors TB1 and TB2. The non-inversion-side (positive) signal VIP that forms the differential input signal VI is input to the gate of the P-type transistor TB1, and the inversion-side (negative) signal VIN that forms the differential input signal VI is input to the gate of the P-type transistor TB2. A current source ISB1 is provided between a node of the high-potential-side power supply VDD and a source node NB1 of the P-type transistors TB1 and TB2.

The N-type differential section NDF includes a pair of N-type transistors TB3 and TB4. The non-inversion-side signal VIP is input to the gate of the N-type transistor T133, and the inversion-side signal VIN is input to the gate of the N-type transistor TB4. A current source ISB2 is provided between a node of the low-potential-side power supply VSS and a source node NB2 of the N-type transistors TB3 and TB4.

As shown in FIG. 7A, the amplifier section 10 includes a first transistor TS1 and a second transistor TS2 (first switch element and second switch element). The P-type transistor TS1 is provided between the source node NB1 of the P-type transistors TB1 and TB2 and the node of the low-potential-side power supply VSS. The transistor TS1 is turned OFF in the operation mode M1, and turned ON in the operation mode M2.

Specifically, a first control signal CTL1 from the detection section 60 (see FIG. 5) is input to the gate of the P-type transistor TS1. The first control signal CTL1 is set to the H level when setting the amplifier circuit to the operation mode M1, so that the P-type transistor TS1 is turned OFF. Therefore, the P-type differential section PDF is turned ON (enabled) (i.e., the amplifier circuit is set to the operation mode M1). The first control signal CTL1 is set to the L level when setting the amplifier circuit to the operation mode M2, so that the P-type transistor TS1 is turned ON. Therefore, since the node NB1 is set to the voltage level of the low-potential-side power supply VSS, the P-type differential section PDF is turned OFF (disabled).

The N-type transistor TS1 is provided between the source node NB2 of the N-type transistors TB3 and TB4 and the node of the high-potential-side power supply VDD. The transistor TS2 is turned ON in the operation mode M1, and turned OFF in the operation mode M2.

Specifically, a control signal CTL2 from the detection section 60 (see FIG. 5) is input to the gate of the N-type transistor TS2. The control signal CTL2 is set to the H level when setting the amplifier circuit to the operation mode M1, so that the N-type transistor TS2 is turned ON. Therefore, since the node NB2 is set to the voltage level of the high-potential-side power supply VDD, the N-type differential section NDF is turned OFF. The control signal CTL2 is set to the L level when setting the amplifier circuit to the operation mode M2, so that the N-type transistor TS2 is turned OFF. Therefore, the N-type differential section NDF is turned ON (i.e., the amplifier circuit is set to the operation mode M2).

The output section QP shown in FIG. 7B includes transistors TC1 to TC14. The P-type transistors TC1 and TC2 are provided in series between the node of the high-potential-side power supply VDD and a node NC1. A bias voltage BP1 is input to the gate of the transistor TC1, and a bias voltage BP2 is input to the gate of the transistor TC2. The drain of the transistor TC1 and the source of the transistor TC2 are connected to a drain node NB5 of the N-type transistor TB3 shown in FIG. 7A.

The P-type transistors TC3 and TC4 are provided in series between the node of the high-potential-side power supply VDD and a node NC2. The bias voltage BP1 is input to the gate of the transistor TC3, and the bias voltage BP2 is input to the gate of the transistor TC4. The drain of the transistor TC3 and the source of the transistor TC4 are connected to a drain node N136 of the N-type transistor TB4 shown in FIG. 7A.

The N-type transistor TC5 and the P-type transistor TC6 are provided in parallel between the node NC1 and a node NC3. A bias voltage BM is input to the gate of the transistor TC5, and a bias voltage BN is input to the gate of the transistor TC6.

The N-type transistor TC7 and the P-type transistor TC8 are provided in parallel between the node NC2 and a node NC4. The bias voltage BM is input to the gate of the transistor TC7, and the bias voltage BN is input to the gate of the transistor TC8.

The N-type transistors TC9 and TC10 are provided in series between the node NC3 and the node of the low-potential-side power supply VSS. A bias voltage BN2 is input to the gate of the transistor TC9, and a bias voltage BN1 is input to the gate of the transistor TC10. The source of the transistor TC9 and the drain of the transistor TC10 are connected to a drain node NB3 of the P-type transistor TB1 shown in FIG. 7A.

The N-type transistors TC11 and TC12 are provided in series between the node NC4 and the node of the low-potential-side power supply VSS. The bias voltage BN2 is input to the gate of the transistor TC11, and the bias voltage BN1 is input to the gate of the transistor TC12. The source of the transistor TC11 and the drain of the transistor TC12 are connected to a drain node NB4 of the P-type transistor TB2 shown in FIG. 7A.

The P-type transistor TC13 and the N-type transistor TC14 in the output stage of the output section QP are provided in series between the high-potential-side power supply VDD and the low-potential-side power supply VSS. The node NC2 is connected to the gate of the transistor TC13, and the node NC4 is connected to the gate of the transistor TC14. The output signal VQ of the amplifier section 10 is output from a drain node of the transistors TC13 and TC14.

Figure 8:
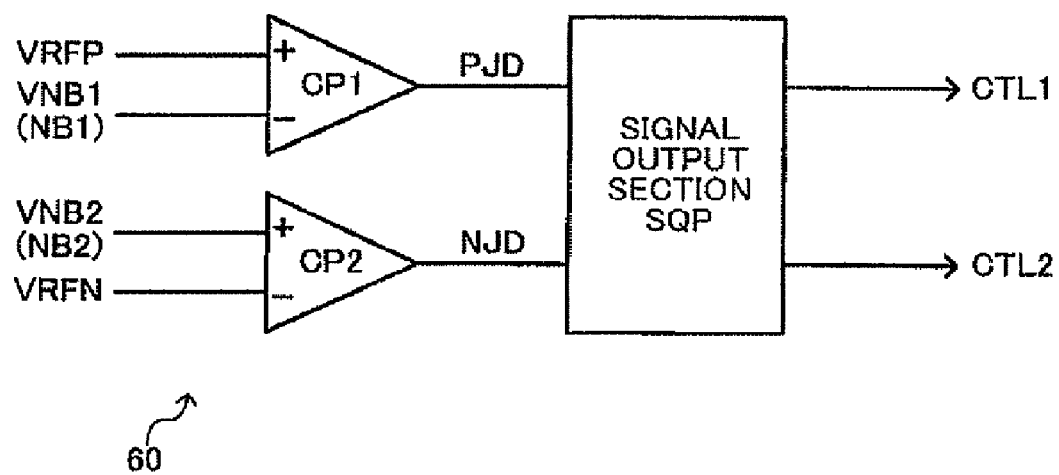
FIG. 8 shows a detailed configuration example of a detection section.

FIG. 8 shows a configuration example of the detection section 60. The detection section 60 detects the first timing T1 by comparing a voltage VNB1 of the source node NB1 of the P-type transistors TB1 and TB2 shown in FIG. 7A with the high-potential-side reference voltage VRFP. The detection section 60 detects the second timing T2 by comparing a voltage VNB2 of the source node NB2 of the N-type transistors TB3 and TB4 with the low-potential-side reference voltage VRFN.

As shown in FIG. 8, the detection section 60 includes a first comparator CP1, a second comparator CP2, and a signal output section SQP.

The comparator CP1 compares the voltage VNB1 of the source node NB1 of the P-type transistors TB1 and TB2 shown in FIG. 7A with the high-potential-side reference voltage VRFP, and outputs a comparison result signal PJD. The reference voltage VRFP is input to the non-inverting input terminal (first input terminal in a broad sense) of the comparator CP1, and the voltage VNB1 is input to the inverting input terminal (second input terminal in a broad sense) of the comparator CP1. Therefore, the comparison result signal PJD is set at the L level when the voltage VNB1 has become higher than the reference voltage VRFP.

The comparator CP2 compares the voltage VNB2 of the source node NB2 of the N-type transistors TB3 and TB4 shown in FIG. 7A with the low-potential-side reference voltage VRFN, and outputs a comparison result signal NJD. The voltage VNB2 is input to the non-inverting input terminal (first input terminal in a broad sense) of the comparator CP2, and the reference voltage VRFN is input to the inverting input terminal (second input terminal in a broad sense) of the comparator CP2. Therefore, the comparison result signal NJD is set at the L level when the voltage VNB2 has become lower than the reference voltage VRFN.

The signal output section SQP receives the comparison result signal PJD from the comparator CP1 and the comparison result signal NJD from the comparator CP2. As shown in FIG. 5, the signal output section SQP outputs the first control signal CTL1 that sets the amplifier section 10 to the operation mode M1 and the second control signal CTL2 that sets the amplifier section 10 to the operation mode M2 to the amplifier section 10.

For example, the signal output section SQP changes the control signal CTL1 from the L level to the H level when the second timing T2 has been detected so that the operation mode is switched from the operation mode M2 to the operation mode M1. Therefore, the P-type transistor TS1 shown in FIG. 7A is turned OFF so that the P-type differential section PDF is turned ON. In this case, since the control signal CTL2 is set to the H level, the N-type transistor TS2 is turned ON so that the N-type differential section NDF is turned OFF.

The signal output section SQP changes the control signal CTL2 from the H level to the L level when the first timing T1 has been detected so that the operation mode is switched from the operation mode M1 to the operation mode M2. Therefore, the N-type transistor TS2 shown in FIG. 7A is turned OFF so that the N-type differential section NDF is turned ON. In this case, since the control signal CTL1 is set to the L level, the P-type transistor TS1 is turned ON so that the P-type differential section PDF is turned OFF. Note that the function of the signal output section SQP may be implemented by an RS latch circuit that performs an RS latch operation using the comparison result signals PJD and NJD, for example.

Figure 9A:
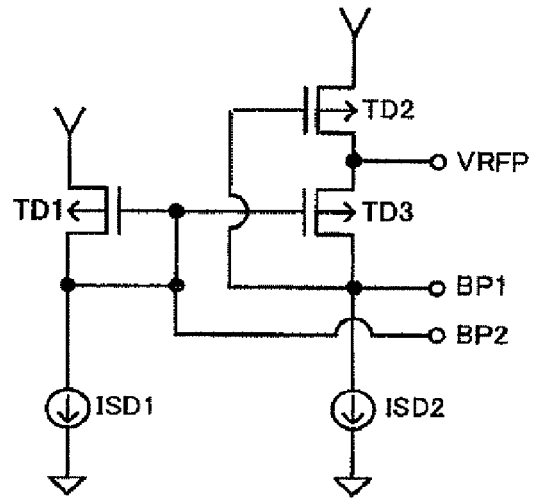
FIGS. 9A to 9C show detailed configuration examples of voltage generation circuits.
Figure 9B:
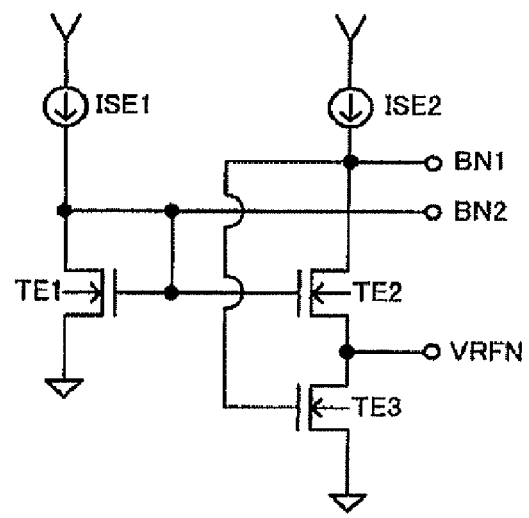
Figure 9C:
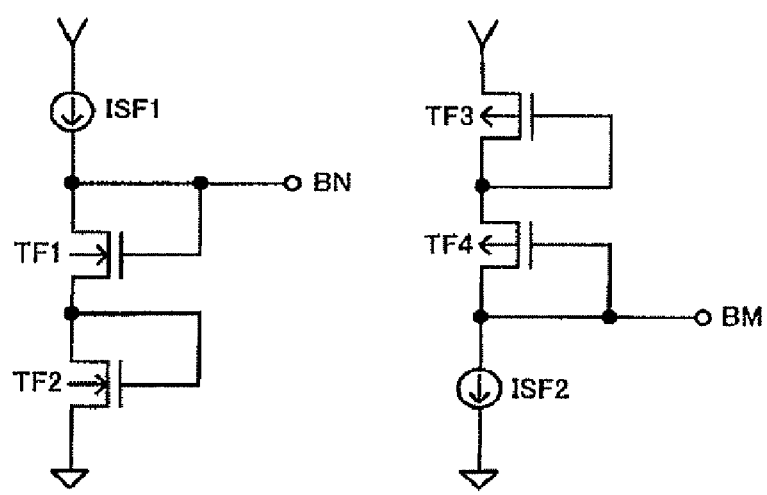

FIGS. 9A to 9C show configuration examples of voltage generation circuits (bias voltage generation circuit and reference voltage generation circuit) used in this embodiment. These voltage generation circuits generate the bias voltages BP1, BP2, BN, BM, BN2, and 13N1 supplied to the output section QP shown in FIG. 7B, and the reference voltages VRFP and VRFN supplied to the detection section 60 shown in FIG. 8.

The voltage generation circuit shown in FIG. 9A includes a P-type transistor TD1 and a current source ISD1 that are provided in series between the high-potential-side power supply VDD and the low-potential-side power supply VSS, and P-type transistors TD2 and TD3 and a current source ISD2 that are provided in series between the high-potential-side power supply VDD and the low-potential-side power supply VSS. The gates of the transistors TD1 and TD3 are connected to the drain of the transistor TD1. The gate of the transistor TD2 is connected to the drain of the transistor TD3. The reference voltage VRFP is output from a drain node of the transistor TD2. The bias voltage BP1 is output from a drain node of the transistor TD3, and the bias voltage BP2 is output from a drain node of the transistor TD1.

In FIG. 9A, when the threshold voltage of the transistor is referred to as VTH, and the saturation drain voltage is referred to as $\Delta V$, the relational expressions "VRFP=$\Delta V$", "BP1=$\Delta V$+VTH", and "BP2=$2\Delta V$+VTH" are satisfied with respect to the high-potential-side power supply VDD. For example, when VDD=3.0 V, VTH=0.6 V, and $\Delta V$=0.2 V, VRFP=VDD−$\Delta V$=3.0−0.2=2.8 V, BP1=3.0−0.2−0.6=2.2 V, and BP2=3.0−0.2×2−0.6=2.0 V.

The voltage generation circuit shown in FIG. 9B includes a current source ISE1 and an N-type transistor TE1 that are provided in series between the high-potential-side power supply VDD and the low-potential-side power supply VSS, and a current source ISE2 and N-type transistors TE2 and TE3 that are provided in series between the high-potential-side power supply VDD and the low-potential-side power supply VSS. The gates of the transistors TE1 and TE2 are connected to the drain of the transistor TE1. The gate of the transistor TE3 is connected to the drain of the transistor TE2. The reference voltage VRFN is output from a drain node of the transistor TE3. The bias voltage BN1 is output from a drain node of the transistor TE2, and the bias voltage BN2 is output from a drain node of the transistor TE1.

In FIG. 9B, when the threshold voltage of the transistor is referred to as VTH, and the saturation drain voltage is referred to as $\Delta V$, the relational expressions "VRFN=$\Delta V$", "BN1=$\Delta V$+VTH", and "BN2=$2\Delta V$+VTH" are satisfied with respect to the low-potential-side power supply VSS. For example, when VTH=0.6 V and $\Delta V$=0.2 V, VRFN=$\Delta V$=0.2 V, BN1=0.2+0.6=0.8 V, and BN2=2×0.2+0.6=1.0 V.

The voltage generation circuit shown in FIG. 9C includes a current source ISF1 and N-type transistors TF1 and TF2 that are provided in series between the high-potential-side power supply VDD and the low-potential-side power supply VSS, and P-type transistors TF3 and TF4 and a current source ISF2 that are provided in series between the high-potential-side power supply VDD and the low-potential-side power supply VSS. The drain and the gate of each of the transistors TF1, TF2, TF3, and TF4 are connected. The bias voltage BN is output from a drain node of the transistor TF1, and the bias voltage BM is output from a drain node of the transistor TF4.

In FIG. 9C, the relational expression "BN=2ΔV+2VTH" is satisfied with respect to the low-potential-side power supply VSS. The relational expression "BM=2ΔV+2VTH" is also satisfied with respect to the high-potential-side power supply VDD. For example, when VDD=3.0 V, VTH=0.6 V, and ΔV=0.2 V, BN=2×0.2+2×0.6=1.6 V, and BM=3.0−2×0.2−2× 0.6=1.4 V.

A detailed operation according to this embodiment is described below using a signal waveform shown in FIG. 10. In FIG. 10, the voltage VNB1 of the node NB1 shown in FIG. 7A is higher than the voltage of the signal VI by a given voltage (e.g., threshold voltage). The voltage VNB2 of the node NB2 is lower than the voltage of the signal VI by a given voltage. In this embodiment, hysteresis characteristics are implemented by utilizing the difference between the voltages VNB1 and VNB2.

Specifically, it is detected that the voltage VNB2 has become higher than the reference voltage VRFN at a timing B1 shown in FIG. 10. Therefore, the comparison result signal NM of the comparator CP2 shown in FIG. 8 changes from the L level to the H level. In this case, the P-type differential section PDF operates in the operation mode M1. The operation mode is not switched from the operation mode M1 to the operation mode M2 based on the change in the comparison result signal NJD at the timing B1.

It is detected that the voltage VNB1 has become higher than the reference voltage VRFP at a timing T1 (B2) shown in FIG. 10. Therefore, the comparison result signal PJD of the comparator CP1 shown in FIG. 8 changes from the H level to the L level.

The control signal CTL2 output from the signal output section SQP then changes from the H level to the L level. Therefore, the N-type transistor TS2 shown in FIG. 7A is turned OFF so that the N-type differential section NDF is turned ON (i.e., the operation mode is switched from the operation mode M1 to the operation mode M2).

The control signal CTL1 then changes from the H level to the L level after the circuit delay time of the signal output section SQP has elapsed. Therefore, the P-type transistor TS1 shown in FIG. 7A is turned ON so that the P-type differential section PDF is turned OFF.

In this embodiment, the P-type differential section PDF is turned OFF after the N-type differential section NDF has been turned ON. This prevents a situation in which the N-type differential section NDF and the P-type differential section PDF are simultaneously turned OFF.

It is detected that the voltage VNB1 has become lower than the reference voltage VRFP at a timing B3 shown in FIG. 10. Therefore, the comparison result signal PJD of the comparator CP1 shown in FIG. 8 changes from the L level to the H level. In this case, the N-type differential section NDF operates in the operation mode M2. The operation mode is not switched from the operation mode M2 to the operation mode M1 based on the change in the comparison result signal PJD.

It is detected that the voltage VNB2 has become lower than the reference voltage VRFN at a timing T2 (B4) shown in FIG. 10. Therefore, the comparison result signal NM of the comparator CP2 shown in FIG. 8 changes from the H level to the L level.

The control signal CTL1 output from the signal output section SQP then changes from the L level to the H level. Therefore, the P-type transistor TS1 shown in FIG. 7A is turned OFF so that the P-type differential section PDF is turned ON (i.e., the operation mode is switched from the operation mode M2 to the operation mode M1).

The control signal CTL2 then changes from the L level to the H level after the circuit delay time of the signal output section SQP has elapsed. Therefore, the N-type transistor TS2 shown in FIG. 7A is turned ON so that the N-type differential section NDF is turned OFF.

In this embodiment, the N-type differential section NDF is turned OFF after the P-type differential section PDF has been turned ON. This prevents a situation in which the P-type differential section PDF and the N-type differential section NDF are simultaneously turned OFF.

According to this embodiment, detection for switching the operation mode is performed by utilizing the hysteresis characteristics, as described with reference to FIG. 6B. This effectively prevents a situation in which the operation mode is frequently switched when the voltage level of the input signal VI is an intermediate voltage level so that the circuit operation becomes unstable.

5. Integrated Circuit Device and Electronic Instrument

Configuration examples of an integrated circuit device according to this embodiment that includes an amplifier circuit and an electronic instrument are described below with reference to FIGS. 11A to 11C. Note that the integrated circuit device according to this embodiment and the electronic instrument are not limited to the configurations shown in FIGS. 11A to 11C. Various modification may be made, such as omitting some of the elements or adding other elements.

Figure 11A:
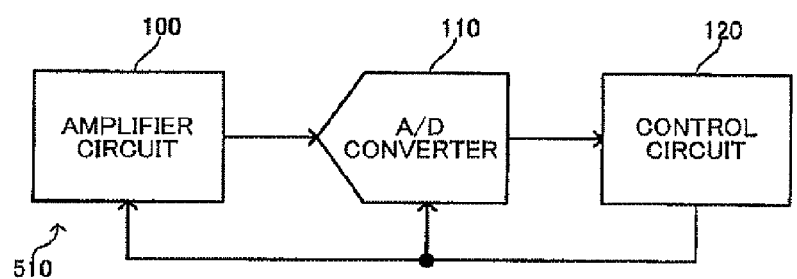
FIGS. 11 to 11C show configuration examples of an integrated circuit device and an electronic instrument according to one embodiment of the invention.

FIG. 11A shows a configuration example of an integrated circuit device 510 according to this embodiment that includes an amplifier circuit. The integrated circuit device 510 includes an amplifier circuit 100, an A/D converter 110, and a control circuit 120. The amplifier circuit 100 amplifies an input signal from a sensor device or the like. The A/D converter 110 A/D-converts the amplified output signal from the amplifier circuit 100, and outputs the resulting digital data to the control circuit 120. The control circuit 120 performs a digital calculation process and controls the amplifier circuit 100 and the A/D converter 110 based on the digital data from the A/D converter 110.

Figure 11B:
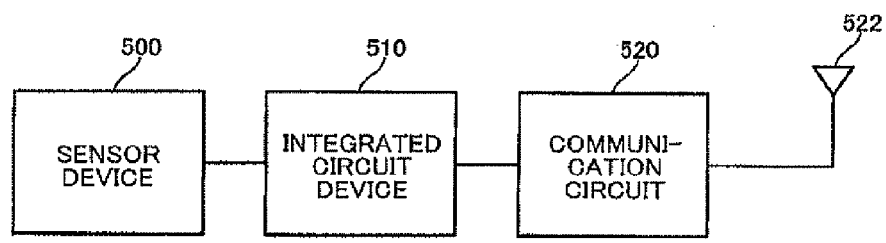

FIG. 11B shows a first configuration example of an electronic instrument that includes the integrated circuit device (amplifier circuit) according to this embodiment. The electronic instrument according to the first configuration example includes a sensor device 500, and the integrated circuit device 510 (analog front-end circuit) according to this embodiment. In the electronic instrument shown in FIG. 11B, the sensor device 500 (physical quantity transducer) detects a physical quantity (e.g., force, acceleration, or mass). The sensor device 500 converts the physical quantity into a current (charge), a voltage, or the like, and outputs the current, voltage, or the like as a detection signal.

The integrated circuit device 510 receives the detection signal from the sensor device 500, A/D-converts the detection signal, and optionally performs a calculation process (signal process) on the digital data obtained by A/D conversion. The integrated circuit device 510 outputs the resulting digital data to a system (system board or system device such as a CPU) in the subsequent stage.

According to the first configuration example, various electronic instruments that include a smoke sensor, an optical sensor, a human detection sensor, a pressure sensor, a biosensor, a gyrosensor, and the like can be implemented.

The electronic instrument according to the first configuration example shown in FIG. 11B further includes a communication circuit (radio circuit) 520 and an antenna 522. The communication circuit 520 performs a modulation process or the like on the digital data from the integrated circuit device 510, and transmits the resulting data to an external instrument (target-side electronic instrument) through the antenna 522. The communication circuit 520 may receive data from the external instrument through the antenna 522 and perform an ID authentication process, or may control the sensor device 500, for example.

According to the first configuration example, it is possible to implement an electronic instrument such as an IC tag (RF tag) that is used for radio frequency identification (RFD) that writes and reads data in a contactless manner by utilizing wireless communication.

Figure 11C:
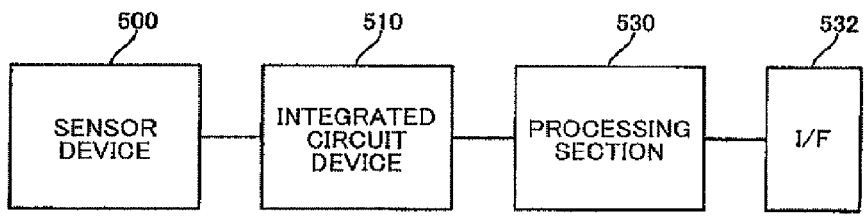

FIG. 11C shows a second configuration example of the electronic instrument according to this embodiment. The electronic instrument shown in FIG. 11C includes a processing section 530 and an interface (I/F) 532 in addition to the integrated circuit device 510. The processing section 530 receives the digital data from the integrated circuit device 510, and performs various processes. The I/F 532 performs data transfer conforming to the USB standard, the IEEE 1394 standard, or the like with an external instrument such as a personal computer (PC).

According to the second configuration example shown in FIG. 11C, it is possible to implement an electronic instrument such as an evaluation device (evaluation board) that is used for development and trial production of the sensor device 500.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The configurations and the operations of the amplifier circuit, the integrated circuit device, and the electronic instrument are not limited to those described in connection with the above embodiments. Various modifications and variations may be made.

What is claimed is:

1. An amplifier circuit comprising:
   an amplifier section that includes a P-type differential section that includes P-type transistors, an N-type differential section that includes N-type transistors, and an output section that outputs an output signal based on an output from the P-type differential section and an output from the N-type differential section;
   an offset adjustment section that adjusts an offset of the amplifier section;
   a first offset adjustment register that stores a first offset adjustment value for the P-type differential section;
   a second offset adjustment register that stores a second offset adjustment value for the N-type differential section;
   a control section that performs an offset setting process that sets the first offset adjustment value stored in the first offset adjustment register into the offset adjustment section in a first operation mode in which the P-type differential section operates, and sets the second offset adjustment value stored in the second offset adjustment register into the offset adjustment section in a second operation mode in which the N-type differential section operates; and
   a detection section that detects a first timing at which an operation mode of the amplification section is switched from the first operation mode to the second operation mode, and a second timing at which the operation mode is switched from the second operation mode to the first operation mode,
   the detection section detecting the first timing using a first reference voltage, detecting the second timing using a second reference voltage that is lower in potential than the first reference voltage, and
   the control section performing the offset setting process based on a detection result of the detection section.

2. The amplifier circuit as defined in claim 1,
   the detection section detecting the first timing and the second timing by voltage determination utilizing hysteresis characteristics, the first reference voltage and the second reference voltage being threshold voltages that specify hysteresis width of the hysteresis characteristics.

3. The amplifier circuit as defined in claim 1,
   the detection section detecting the first timing by comparing a voltage of a source node of the P-type transistors of the P-type differential section with the first reference voltage, and detecting the second timing by comparing a voltage of a source node of the N-type transistors of the N-type differential section with the second reference voltage.

4. The amplifier circuit as defined in claim 1,
   the detection section including:
   a first comparator that compares a voltage of a source node of the P-type transistors of the P-type differential section with the first reference voltage;
   a second comparator that compares a voltage of a source node of the N-type transistors of the N-type differential section with the second reference voltage; and
   a signal output section that receives a comparison result signal from the first comparator and a comparison result signal from the second comparator, and outputs a first control signal and a second control signal to the amplifier section, the first control signal setting the operation mode of the amplifier section to the first operation mode, and the second control signal setting the operation mode of the amplifier section to the second operation mode.

5. The amplifier circuit as defined in claim 1,
   the amplifier section including:
   a first transistor that is provided between a source node of the P-type transistors of the P-type differential section and a low-potential-side power supply node, the first transistor being turned OFF in the first operation mode, and turned ON in the second operation mode; and
   a second transistor that is provided between a source node of the N-type transistors of the N-type differential section and a high-potential-side power supply node, the second transistor being turned ON in the first operation mode, and turned OFF in the second operation mode.

6. An integrated circuit device comprising the amplifier circuit as defined in claim 1.

7. An electronic instrument comprising the integrated circuit device as defined in claim 6.

8. An amplifier circuit comprising:
   an amplifier section that includes a P-type differential section that includes P-type transistors, an N-type differential section that includes N-type transistors, and an output section that outputs an output signal based on an output from the P-type differential section and an output from the N-type differential section; and
   a detection section that detects a first timing at which an operation mode of the amplifier section is switched from a first operation mode in which the P-type differential section operates to a second operation mode in which the N-type differential section operates, and a second timing at which the operation mode is switched from the second operation mode to the first operation mode, the detection section detecting the first timing using a first reference voltage, and detecting the second timing using a second reference voltage that is lower in potential than the first reference voltage, and the detection section detecting the first timing and the second timing by voltage determination utilizing hysteresis characteristics, the first reference voltage and the second, reference voltage being threshold voltages that specify hysteresis width of the hysteresis characteristics.

9. The amplifier circuit as defined in claim 8, the detection section detecting the first timing by comparing a voltage of a source node of the P-type transistors of the P-type differential section with the first reference voltage, and detecting the second timing by comparing a voltage of a source node of the N-type transistors of the N-type differential section with the second reference voltage.

10. An integrated circuit device comprising the amplifier circuit as defined in claim 8.

11. An electronic instrument comprising the integrated circuit device as defined in claim 10.

* * * * *